United States Patent
Kweon

(10) Patent No.: US 6,744,092 B2
(45) Date of Patent: Jun. 1, 2004

(54) SEMICONDUCTOR MEMORY DEVICE CAPABLE OF PREVENTING OXIDATION OF PLUG AND METHOD FOR FABRICATING THE SAME

(75) Inventor: Soon-Yong Kweon, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/127,423

(22) Filed: Apr. 23, 2002

(65) Prior Publication Data

US 2003/0001186 A1 Jan. 2, 2003

(30) Foreign Application Priority Data

Jun. 30, 2001 (KR) ........................................ 2001-38688

(51) Int. Cl.[7] ............................................. H01L 21/336
(52) U.S. Cl. ........................ 257/303; 257/306; 257/310
(58) Field of Search ................................ 257/303, 306, 257/310; 438/3, 240

(56) References Cited

U.S. PATENT DOCUMENTS

| | | | |
|---|---|---|---|
| 5,856,704 A | * | 1/1999 | Schuele ...................... 257/754 |
| 6,043,529 A | * | 3/2000 | Hartner et al. ............... 257/306 |
| 6,180,447 B1 | * | 1/2001 | Park et al. ................... 438/240 |
| 6,400,552 B2 | * | 6/2002 | Al-Shareef et al. ......... 361/313 |
| 6,590,246 B1 | * | 7/2003 | Agarwal ...................... 257/296 |
| 6,645,779 B2 | * | 11/2003 | Hong ............................ 438/3 |
| 2001/0020715 A1 | * | 9/2001 | Yamasaki et al. ........... 257/310 |
| 2002/0070404 A1 | * | 6/2002 | Bruchhaus et al. ......... 257/310 |
| 2002/0084481 A1 | * | 7/2002 | Lian et al. ................... 257/310 |

FOREIGN PATENT DOCUMENTS

| | | | |
|---|---|---|---|
| KR | 1999-10450 | 2/1999 | ........... H01L/27/04 |
| KR | 2001-1595 | 1/2001 | ......... H01L/27/108 |

* cited by examiner

*Primary Examiner*—George Fourson
*Assistant Examiner*—Michelle Estrada
(74) *Attorney, Agent, or Firm*—Jacobson Holman PLLC

(57) ABSTRACT

A semiconductor device and a fabrication method thereof provides a plug structure composed of a diffusion barrier layer formed at the bottom and on the sides of a contact hole and an oxidation barrier layer formed on the diffusion barrier layer that fills up the inside of the contact hole. This invention prevents contact resistance of a bottom electrode and a plug from increasing as well as implementing high-speed operation and improving the reliability of the semiconductor device.

8 Claims, 3 Drawing Sheets

SEMICONDUCTOR MEMORY DEVICE CAPABLE OF PREVENTING OXIDATION OF PLUG AND METHOD FOR FABRICATING THE SAME

FIELD OF THE INVENTION

The present invention relates to a ferroelectric RAM (FeRAM) device; and, more particularly, to a memory device that prevents oxidation of a plug caused by oxygen diffusion into the interface between the plug and the bottom electrode and a fabrication method thereof.

DESCRIPTION OF THE PRIOR ART

A ferroelectric RAM (FeRAM) device is a sort of a nonvolatile memory device using a polarization property of a ferroelectric layer and hysteresis. It is an ideal memory with the advantage of retaining stored information even when the power is turned off, as well as high speed, high capacity and low electric power. As for the dielectric material of the FeRAM, a layer of $SrBi_2Ta_2O_9$ (SBT), $Sr_xBi_{2-y}(Ta_jNb_j)_2O_{9-z}$ (SBTN), $Pb(Zr_xTi_{1-x})O_3$ (PZT), $SrTiO_3$ (ST) or $Bi_{4-x}La_xTi_3O_{12}$ (BLT) is mostly used. The bottom electrode of a capacitor incorporating the ferroelectric layer is usually formed of Pt, Ir, Ru or an oxide thereof.

To apply the conventional fabrication method of a memory device to the method of fabricating a FeRAM device, it is better to use a ferroelectric layer which has a low crystallization temperature. Also, the contact resistance between the bottom electrode of the capacitor and the plug should be prevented from increasing. Studies on lowering the crystallization temperature of a conventional ferroelectric layer have made much progress, but the technology preventing the increase of a contact resistance between the plug and the bottom electrode is at a standstill. The contact resistance between the plug and the bottom electrode increases, because the polysilicon plug is oxidized during the procedure of a high temperature thermal treatment in an ambient of oxygen for forming a ferroelectric layer. That is, in the subsequent thermal process carried out in an ambient of oxygen for crystallizing the ferroelectric layer, the oxygen diffuses into the interface of the polysilicon plug and the capacitor bottom electrode and oxidizes the surface of polysilicon plug, thus increasing the contact resistance.

FIG. 1 is a cross-sectional view illustrating a structure of a ferroelectric capacitor of a conventional semiconductor device. The semiconductor device of FIG. 1 is formed by a method described below. That is, an inter-layer dielectric layer (ILD) is deposited on the semiconductor substrate 145 with a high doping area 140, and a contact hole connected to the high doping area 140 is formed by selectively etching the ILD. Subsequently, a polysilicon plug 100 is formed by filling up the contact hole with polysilicon, and then a barrier layer 150 of Ti, TiN or TaN is formed on the polysilicon plug 100. After that, a capacitor composed of a bottom electrode 125, a ferroelectric layer 130 and a top electrode 135 is formed on the barrier layer 150.

As described above, the oxygen diffusion barrier layer 150 is formed of Ti, TiN or TaN between the bottom electrode 125 and the polysilicon layer plug 150 to prevent the oxygen from being diffused. However, the barrier layer 150 formed of Ti, TiN or TaN cannot perform its role properly because it loses its characteristics as a diffusion barrier layer at around 500° C. Although studies have been done on the barrier metal of a three-element compound such as TiAlN or TaSiN, to prevent the diffusion more effectively, the problem of the barrier layer 150 being oxidized at over 600° C. or of the barrier layer structure being destroyed has not been solved yet.

In addition, the structure of the semiconductor device shown in FIG. 1 has a problem that the barrier layer 150 becomes non-conductive, because the bottom electrode 125 and the sides of the barrier layer 150 are exposed during the formation process of a ferroelectric layer 130 and the barrier layer 150 is oxidized while the ferroelectric layer is deposited.

Therefore, researchers are actively conducting research to prevent the oxidation by transforming the structure of a plug. That is, the aim of the research is moving from developing oxygen diffusion materials towards a method for blocking the oxygen diffusion or increasing paths for oxygen.

FIG. 2 shows a structure forming the barrier layer 150 in the contact hole, which is known as a stable plug structure. The reference numerals of FIG. 2 are the same as those of FIG. 1. However, the structure of the semiconductor device shown in FIG. 2 is more or less acceptable in the aspect of anti-oxidation, compared to other existing structures, but this structure as well does not prevent oxygen diffusion effectively. As an example of this, in the case the bottom electrode 125 of a semiconductor device with the structure of FIG. 2 is formed of Pt which causes a lot of oxygen diffusion, and the barrier layer 150 is formed of TiN, the property of the semiconductor deteriorates in a thermal process carried out at around 500° C. Moreover, when doing so, the fabricating process becomes more complicated than fabricating the semiconductor device structure of FIG. 1, which leads to an increase in production costs.

SUMMARY OF THE INVENTION

It is, therefore, an object of the present invention to provide a semiconductor device, which employs an oxygen diffusion barrier layer inside a plug to protect the plug from being oxidized during a high temperature thermal treatment in an ambient of oxygen effectively, and a fabrication method thereof.

In accordance with an embodiment of the present invention, there is provided a semiconductor device, comprising: an inter-layer dielectric layer formed on a semiconductor substrate with a contact hole inside; a diffusion barrier layer formed at the bottom and on the sides of the contact hole; an oxidation barrier layer formed on the diffusion barrier layer for filling up the contact hole; a bottom electrode of a capacitor contacting the diffusion barrier layer and the anti-oxidation layer; a dielectric layer formed on the bottom electrode; and a top electrode formed on the dielectric layer.

In accordance with an embodiment of the present invention, there is provided a method for fabricating a semiconductor device, comprising the steps of: forming an inter-layer dielectric layer on a semiconductor substrate; forming a contact hole by selectively etching the inter-layer dielectric layer; forming a diffusion barrier layer at the bottom and on the sides of the contact hole; filling up the contact hole by forming an oxidation barrier layer on the anti-diffusion layer; forming a bottom electrode of a capacitor contacting the diffusion barrier layer and the anti-oxidation layer; forming a dielectric layer on the bottom electrode; and forming a top electrode on the dielectric layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Other objects and aspects of the invention will become apparent from the following description of the embodiments with reference to the accompanying drawings, which is set forth hereinafter.

Figure 1:
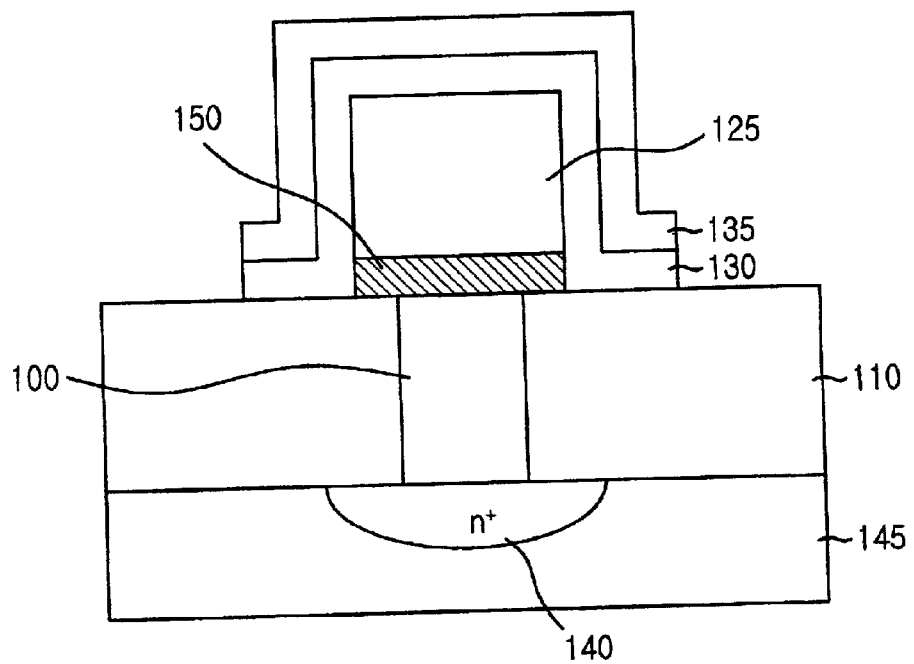
FIG. 1 is a cross-sectional view illustrating a structure of a ferroelectric capacitor of a conventional semiconductor device.
Figure 2:
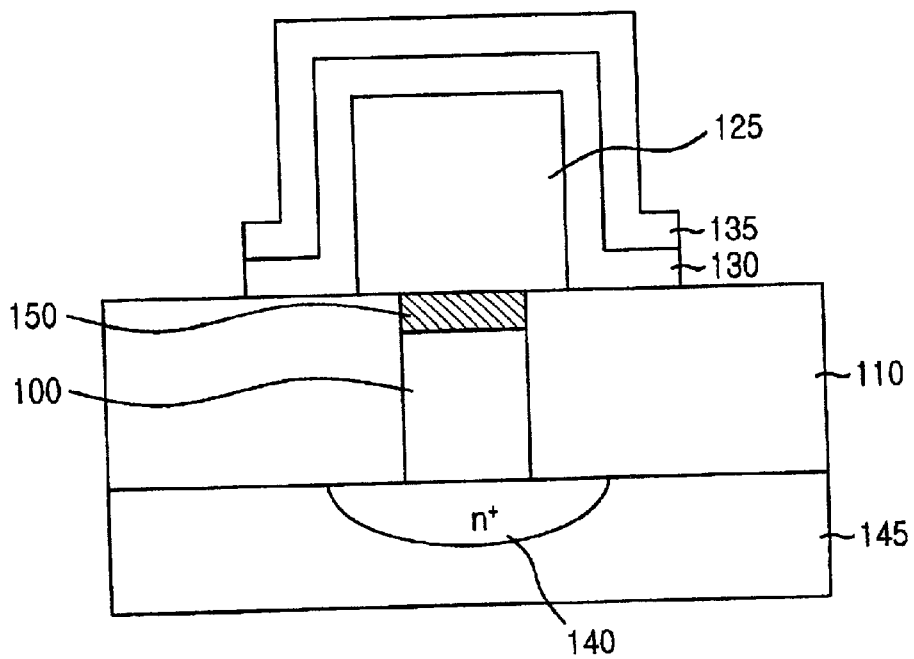
FIG. 2 is a cross-sectional view showing a structure of a ferroelectric capacitor of another conventional semiconductor device.
Figure 3A:
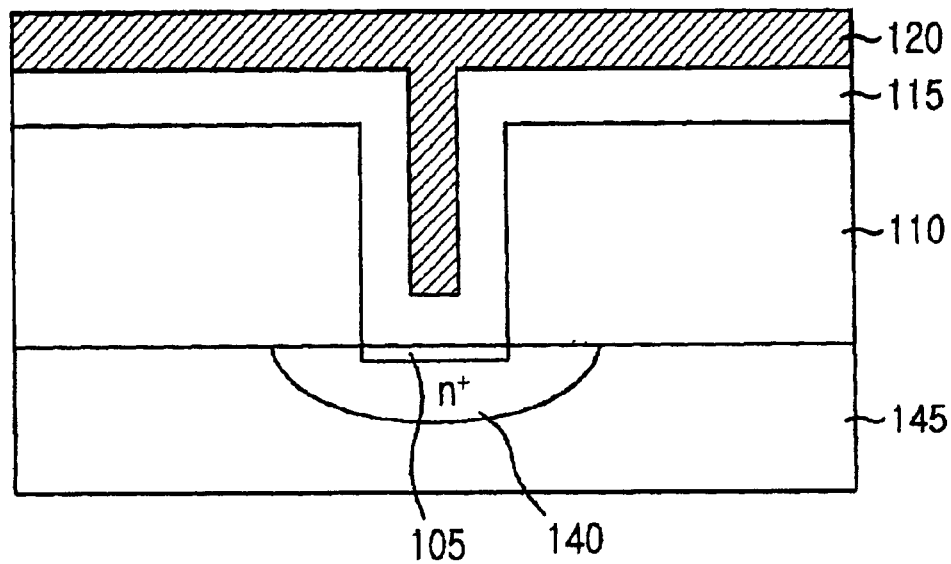
FIGS. 3A to 3D represent a method for fabricating a ferroelectric capacitor of a semiconductor device in accordance with an embodiment of the present invention.

As shown in FIG. 3A, an inter-layer dielectric layer (ILD) 110 is deposited on a silicon substrate 145 with a high doping area. Next, it is optionally etched and a contact hole is formed to expose the silicon substrate 145. After that, a silicide layer 105 is formed at the bottom of the contact hole.

The silicide layer 105 is formed in a method as follows. First, on the structure having a contact hole, a metal layer of at least one of Ti, Co and Ni is deposited by ionized metal plasma physical vapor deposition (IMP-PVD), collimated plasma physical vapor deposition (colli-PVD), chemical vapor deposition (CVD) or atomic layer deposition (ALD). Then, the silicon substrate under the contact hole is made to have a chemical reaction with the metal layer by carrying out a rapid thermal annealing process (RTP) or a thermal treatment using a furnace. As a result, a silicide layer 105 of $TiSi_2$, $CoSi_2$ or $NiSi_2$ is formed at the bottom of the contact hole, and, thereafter, the metal layer on the inter-layer dielectric layer 110 is removed with a mixed solution of $NH_4OH$, $H_2O_2$ and $H_2O_2$.

Subsequently, a diffusion barrier layer 115 is deposited at a thickness of 50 Å to 1000 Å on the entire surface of the substrate structure where the silicide layer 105 is formed. Here, the diffusion barrier layer 115 should be deposited on the side and at the bottom of the contact hole so that the inside of the contact hole is not filled with the diffusion barrier layer 115. The diffusion barrier layer 115 is formed by depositing TiN, TiAlN, TiSiN, TaN or TaSiN with a method of CVD, ALD, IMP-PVD or colli-PVD. After the diffusion barrier layer is deposited, an oxygen plasma treatment may be performed to improve the diffusion blocking property.

Subsequently, the inside of the contact hole is filled up completely by depositing an oxidation barrier layer 120 of one of Ir and Ru, elements with good oxygen diffusion preventing properties, on the diffusion barrier layer 115 at a thickness of 50 Å to 5000 Å. The oxidation barrier layer 120 is deposited with a CVD, ALD or electro-chemical deposition method that has high step coverage.

After the oxidation barrier layer 120 is deposited, an RTP, a thermal treatment using a furnace or a plasma thermal treatment is performed in an ambient of oxygen, nitrogen or argon at a temperature of 400~800° C. to stabilize oxidation barrier layer 120. The time for thermal treatment is 1 second to 10 minutes for the RTP; and 10 minutes to 5 hours for the furnace thermal treatment. In the meantime, the plasma thermal treatment is performed with $O_2$, $O_3$, $N_2$, $N_2O$ or $NH_3$ plasma.

Figure 3B:
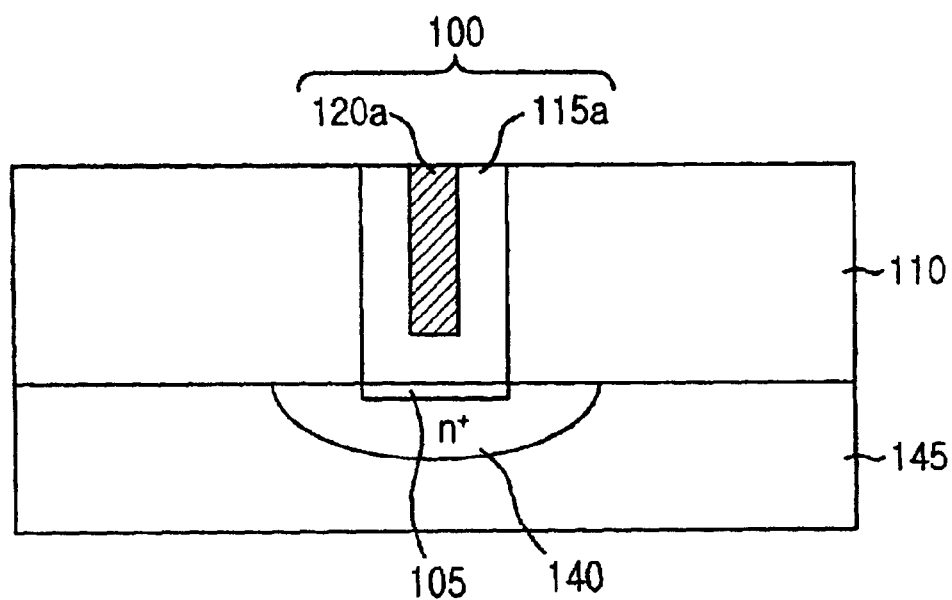

Subsequently, as illustrated in FIG. 3B, a plug 100 composed of the oxidation barrier pattern 120A and a diffusion barrier pattern 115A are formed inside the contact hole by removing the oxidation barrier layer 120 and the diffusion barrier layer 115 with a chemical mechanical polishing process or etching process until the inter-layer dielectric layer (ILD) 110 is exposed.

Figure 3C:
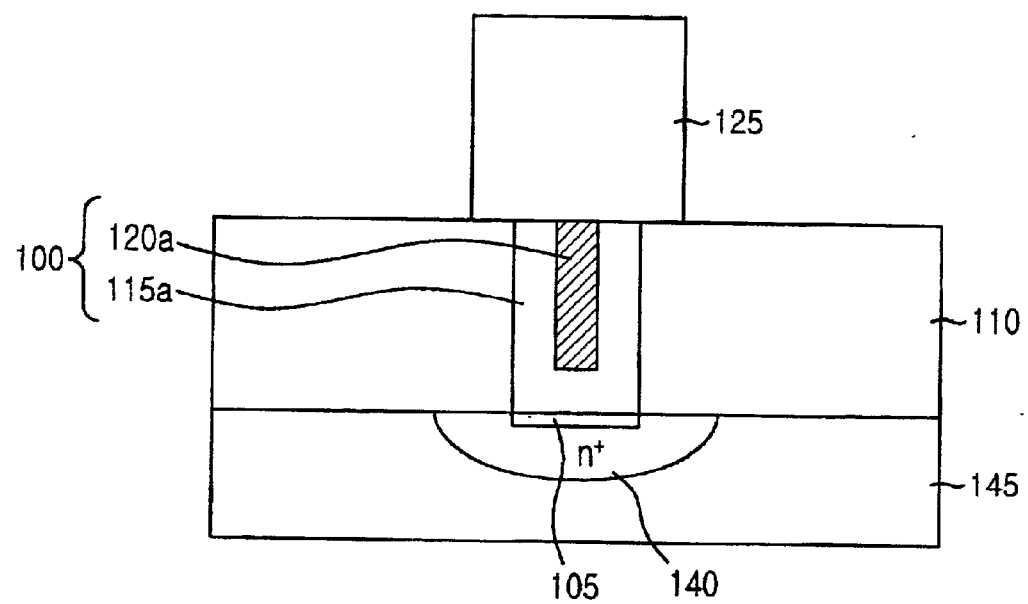

Subsequently, a bottom electrode 125 is formed on the plug 100 as illustrated in FIG. 3C. The bottom electrode 125 is formed by depositing $IrO_x$ or $RuO_x$ at a thickness of 1000 Å to 10000 Å using a PVD, CVD or ALD method, and performing a patterning process, which is composed of lithography and etching procedures.

After the bottom electrode 125 is formed, an RTP, a thermal treatment using a furnace or a plasma thermal treatment is carried out. The RTP is carried out in an ambient of $O_2$, $O_3$, $N_2$ or Ar at a temperature of 400~800° C. The time for thermal treatment is 1 second to 10 minutes for the RTP; and 10 minutes to 5 hours for the furnace thermal treatment. In the meantime, the plasma thermal treatment is carried out with $O_2$, $O_3$, $N_2$, $N_2O$ or $NH_3$ plasma.

Figure 3D:
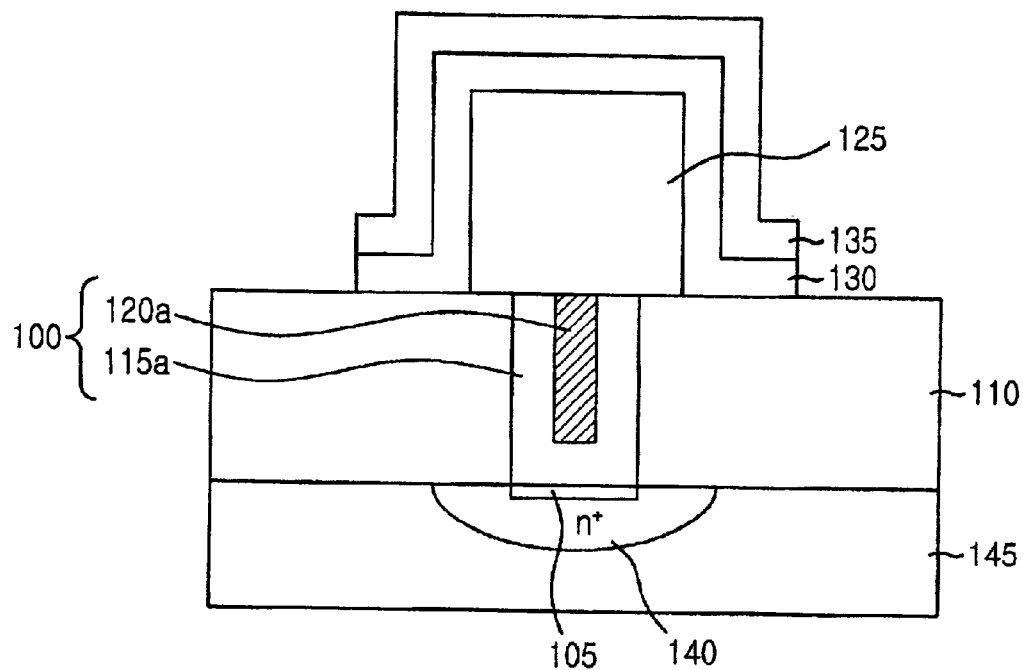

Subsequently, as illustrated in FIG. 3D, a ferroelectric layer 130 and a top electrode 135 are formed on the bottom electrode 125. The ferroelectric layer 130 is formed of $SrBi_2Ta_2O_9$ (SBT), $Sr_xBi_{2-y}(Ta_zNb_j)_2O_{9-z}$ (SBTN), $Pb(Zr_x, Ti_{1-x})O_3$ (PZT), $SrTiO_3$ (ST) or $Bi_{4-x}La_xTi_3O_{12}$ (BLT) at a thickness of 20 Å to 2000Å. It is deposited with a CVD or ALD method that has superior step coverage. After the deposition, it goes through a thermal process in an ambient of $O_2$, $N_2$, $O_3$, He, Ne and Kr for 10 minutes to 5 hours.

After that, the device is finally completed by forming an inter-layer dielectric layer, interconnection and passivation.

The present invention described above prevents an increase in a contact resistance caused by oxygen diffusion in a high temperature thermal treatment in an ambient of oxygen to form a ferroelectric layer by forming a plug composed of an oxidation barrier layer and a diffusion barrier layer instead of a conventional polysilicon plug. The oxidation barrier layer and a diffusion barrier layer are good for high-speed operation because the plug resistance is remarkably low compared to a polysilicon.

While the present invention has been described with respect to certain preferred embodiments, it will be apparent to those skilled in the art that various changes and modifications may be made without departing from the scope of the invention as defined in the following claims.

What is claimed is:

1. A semiconductor device, comprising:
   an inter-layer dielectric layer formed on a semiconductor substrate with a contact hole inside;
   a diffusion barrier layer formed at the bottom and on the sides of the contact hole;
   an oxidation barrier layer formed on the diffusion barrier layer for filling up a remaining portion of the contact hole;
   a bottom electrode of a capacitor covering a surface of the diffusion barrier layer and the oxidation barrier layer;
   a dielectric layer formed on the bottom electrode; and
   a top electrode formed on the dielectric layer,
   wherein the diffusion barrier layer and the oxidation barrier layer are formed inside the contact hole.

2. The semiconductor device as recited in claim 1, wherein the diffusion barrier layer is formed of any one selected from a group consisting of TiN, TiAlN, TiSiN, TaN and TaSiN.

3. The semiconductor device as recited in claim 1, wherein the oxidation barrier layer is formed of any one selected from a group consisting of Ir and Ru.

4. The semiconductor device as recited in claim 1, wherein the dielectric layer is a ferroelectric layer.

5. The semiconductor device as recited in claim 2, further comprising a silicide layer between the diffusion barrier layer and the bottom of the contact hole.

6. The semiconductor device as recited in claim 5, wherein the silicide layer is formed of any one selected from a group consisting of $TiSi_2$, $CoSi_2$ and $NiSi_2$.

7. The semiconductor device as recited in claim 1, wherein the bottom electrode is formed of any one selected from a group consisting of $IrO_x$ and $RuO_x$.

8. The semiconductor device as recited in claim 4, wherein the ferroelectric layer is formed of any one selected from a group consisting of $SrBi_2Ta_2O_9$, $Sr_xBi_{2-y}(Ta_iNb_j)_2O_{9-z}$, $Pb(Zr_x,Ti_{1-x})O_3$, $SrTiO_3$ and $Bi_{4-x}La_xTi_3O_{12}$.

* * * * *